United States Patent [19]

Assel et al.

[11] Patent Number: 4,879,434

[45] Date of Patent: Nov. 7, 1989

[54] SUBASSEMBLY CASE INCLUDING A FLAT SHEET METAL SHIELD FASTENED WITH V-SHAPED SPRING CLIPS

[75] Inventors: Eugen Assel, Knetzgau; Burkhard Dasbach, Steinbach; Bruno Gebhard, Forchheim, all of Fed. Rep. of Germany

[73] Assignee: Siemens Aktiengesellschaft, Berlin & Munich, Fed. Rep. of Germany

[21] Appl. No.: 256,047

[22] Filed: Oct. 11, 1988

[30] Foreign Application Priority Data

Oct. 30, 1987 [DE] Fed. Rep. of Germany ....... 8714497

[51] Int. Cl.$^4$ .......................... H05K 7/18; H05K 9/00
[52] U.S. Cl. .................................. 174/35 R; 361/383; 361/424
[58] Field of Search .......... 174/35 R, 35 GC, 35 MS; 361/383, 390, 391, 415, 424, 429

[56] References Cited

U.S. PATENT DOCUMENTS

| | | | |
|---|---|---|---|
| 3,340,587 | 9/1967 | Beyer | 174/35 MS |
| 3,502,784 | 3/1970 | Kunkel | 174/35 GS |
| 4,114,848 | 9/1978 | Bernard | 248/346 |
| 4,716,493 | 12/1987 | Zelkowitz | 361/383 |

FOREIGN PATENT DOCUMENTS 802586 10/1958 United Kingdom .

OTHER PUBLICATIONS

"Einbausystem ES 902C 19-Zoll-Bauweise", Katalog ET 1.1, Ausgabe 1987, Siemens Aktiengesellschaft.

Primary Examiner—Laramie E. Askin
Attorney, Agent, or Firm—Kenyon & Kenyon

[57] ABSTRACT

A subassembly case (2) including a sheet metal shield (10) consisting of electrically conductive material, having venting holes (12), and being supported by recessed shoulders (18,20) on front and rear members (6, 8) of the subassembly case (2) to which it is detachably connected. The sheet metal shield (10) is flat and provided with holes of rectangular shape which are arranged in two rows (28, 30) and with their short sides (32) next to each other along a bearing area (14, 16) of the sheet metal shield (10). The sheet metal shield (10) is connected to the shoulders (18, 20) of the members (6, 8) by means of V-shaped fastening spring clips (34) each consisting of electrically conductive material and provided with lateral projections (36). In the snapped-in position of the fastening spring clips (34), the leg (40) of each fastening spring clip (34), designed as a detent hook (42), grips behind the respective shoulder (18, 20) of the front and rear members (6, 8). A sheet metal shield (10) is thus obtained whose storage or transport volume is substantially reduced and which can be detachably joined to the members (6,8) of the subassembly case (2) without additional holes in subassembly case parts.

4 Claims, 1 Drawing Sheet

SUBASSEMBLY CASE INCLUDING A FLAT SHEET METAL SHIELD FASTENED WITH V-SHAPED SPRING CLIPS

BACKGROUND OF THE INVENTION a. Field of the Invention

The invention relates to a subassembly case including a flat sheet metal shield consisting of electrically conducting material, having venting holes, and being supported by recessed shoulders on the front and rear members of the subassembly case to which it is detachably connected by V-shaped fastening spring clips.

b. Description of the prior Art

A sheet metal shield of a subassembly case is described in a catalog ET 1.1 entitled "Mounting System ES 902C 19-Inch Type" by Siemens AG, 1987 issue, Ordering No. E86010-K4101-A211-A1. This sheet metal shield is edged on all sides. The face edges of the sheet metal shield contain captured nuts for ratchet screws. This sheet metal shield is screwed to the sides of the subassembly case. This sheet metal shield has the disadvantage that substantial storage or transport volume is required due to its edges all around. Moreover, additional holes in the side parts of the subassembly case are needed to attach the shield.

OBJECTS AND SUMMARY OF THE INVENTION

It is an object of the invention to improve the above-mentioned sheet metal shield so that its storage or transport volume is substantially reduced and so that the sheet metal shield is detachably connectable to the front and rear members of the subassembly case without addition holes in the front and rear members of the subassembly case.

According to the invention, this problem is solved in that the sheet metal shield is flat and provided with holes of rectangular shape which are arranged in two rows and with their short sides adjacent to each other along a bearing area of the sheet metal shield and in that the sheet metal shield is connected to the front and rear members of the subassembly case by means of V-shaped fastening spring clips consisting of electrically conducting material and provided with lateral projections in such a manner that, in the snapped-in position of the fastening spring clips, a leg of each fastening strip clip, designed with a detent hook, grips behind a respective shoulder.

Due to the flat design of the sheet metal shield, it can be made from a metal sheet or from coiled strip, this latter semi-finished product being preferable when larger quantities and automated production are involved. The advantage of this "yard ware" is that a metal shield can be produced in certain preselected sizes, e.g. 25 mm, for each subassembly case width by simply cutting it to length. Due to their flat design, the sheet metal shields require small storage or transport volume.

The V-shaped fastening spring clips are provided for electrical contacting and mechanical fastening of the sheet metal shield. These fastening spring clips are inserted into the rectangular holes, their dropping into the interior of the subassembly case being prevented by two respective outer projections on the fastening spring clips. The fastening spring clips are each inserted into the rectangular holes in such a manner that the free ends of both legs thereof always point in the direction of the corresponding subassembly case member. To snap the fastening spring clips in, they can be pushed singly or serially against the corresponding front and rear members as a stop. Depending on the shielding required and on the mechanical stability, the number of fastening spring clips may be varied over the subassembly case width. It is of particular advantage that the sheet metal shield can be connected to the front and rear members of the subassembly case without additional holes in the latter, and that the mechanical connection between the sheet metal shield and the front and rear members of the subassembly case can be made quickly and easily.

In one advantageous embodiment of the fastening spring clip, the free end of one of the legs of the V-shaped fastening spring clip is provided with a folded edge. With the help of this folded edge, oxide films on the sheet metal shield in the contact zone area of the fastening spring clip are scratched away when snapping the fastening spring clip in. This improves substantially the electrically conductive connection between the sheet metal shield and the front and rear members of the subassembly case so that electrical interference current can be diverted from the sheet metal shield to the subassembly case components.

In another advantageous embodiment of the fastening spring clip, the free end of one of the legs of the V-shaped fastening spring clip is provided with a folded edge. This reduces considerably the force needed to snap the fastening spring clip in, as compared with the design without the folded edge, thereby diminishing the electrical conductivity between the sheet metal shield and the front and rear members of the subassembly case.

DETAILED DESCRIPTION OF THE INVENTION SUBASSEMBLY CASE

Figure 1:
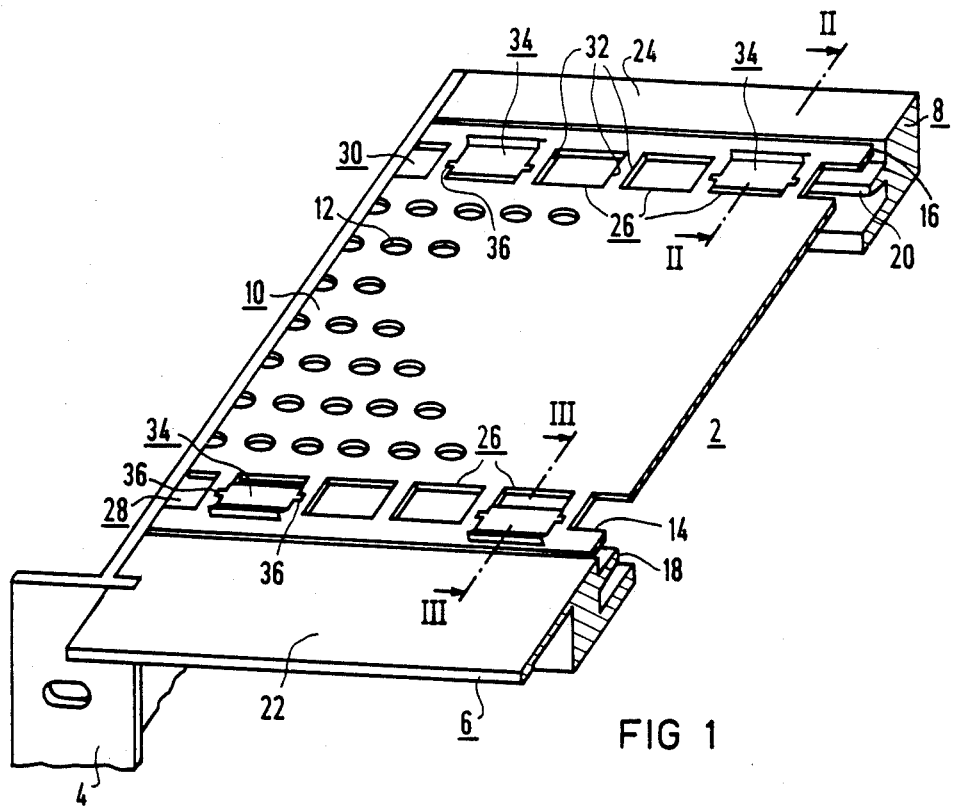
FIG. 1 is a perspective view, partly in section, of a subassembly case including a flat sheet metal shield in accordance with this invention.

FIG. 1 shows only an upper portion of a subassembly case 2, having a side member 4, a front member 6, a rear member 8 and a flat sheet metal shield 10. The flat sheet metal shield 10 is made of an electrically conductive material such as aluminum and is provided with venting holes 12. The sheet metal shield 10 has bearing areas 14, 16 at which said shield is supported by a shoulder 18 and 20, respectively, formed on front and rear members 6 and 8. In relation to the top surfaces 22, 24 of the front and rear members 6, 8, respectively, the shoulders 18, 20 are lowered so that the sheet metal shield is approximately flush with the top surfaces 22, 24. Disposed next to each other along the rows 28 and 30, respectively, are several holes 26 of rectangular shape. The narrow sides 32 of the rectangular holes 26 are disposed adjacent to each other. Some of these rectangular holes 26 are provided with V-shaped fastening spring clips 34, made of electrically conductive material. The fastening spring clips 34 of row 28 of rectangular holes are illustrated in snapped-in position in FIG. 3, while the fastening spring clips 34 of row 30 of rectangular holes are illustrated in a free position in FIG. 2. In order to ensure that the fastening spring clips 34 do not drop into the interior of the subassembly case 2 after their insertion into the rectangular holes 26 of the sheet metal shield 10, the spring clips are each provided with lateral projections 36.

Figure 2:
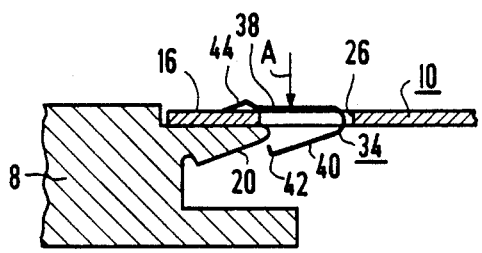
FIG. 2 is a detail view of a fastening spring clip inserted into the sheet metal shield as viewed along a section II—II in FIG. 1.

FIG. 2 shows a sectional view of a fastening spring clip 34 inserted into a rectangular hole 26. Arrow A indicates the insertion direction of the fastening spring clip 34. By means of lateral projections 36 and by means of the free end of its leg 38 the V-shaped fastening spring clip 34 supports itself on the sheet metal shield 10. The sheet metal shield 10 is supported by the shoulder 20 of the rear member 8 by means of the bearing area 16. The leg 40 of the fastening spring clip 34 is shaped to conform to the corresponding shoulder 20. The free end of the leg 38 is provided with a folded edge 44.

Figure 3:
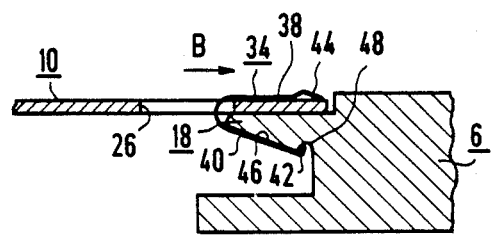
FIG. 3 is a detail view of a snapped-in fastening spring clip as viewed along a section III—III in FIG. 1.

In FIG. 3 is shown a section along the dashed line III—III in FIG. 1. This sectional view shows a fastening spring clip 34 snapped into a rectangular hole 26. Moved by a force indicated by an arrow B, the fastening spring clip 34 is shifted from the position of FIG. 2 into the position shown in FIG. 3. When snapping in, the detent hook 42 of the leg 40 of the fastening spring clip 34 slides over a sliding surface 46 of the shoulder 18 of the front member 6 until the detent position is reached. As soon as the detent position is reached, the detent hook 42 snaps into a notch 48 of the shoulder 18. While the detent hook 42 slides on the sliding surface 46, the folded edge 44 of the leg 38 scratches the sheet metal shield 10, thereby partially removing any oxide films which may have developed in the contact zone area. In the snapped-in position shown, the sheet metal shield 10 is mechanically joined to the members 6 and 8 of the subassembly case 2 in a captive fashion and any interference electrical currents flow from the sheet metal shield 10 to parts of the subassembly case 2.

What is claimed is:

1. A subassembly case comprising: front and rear members having corresponding front and rear recessed shoulders; a flat sheet shield made of a conductive material and having a plurality of venting holes, and two bearing areas, each bearing area having a row of rectangular holes, each hole having a short side, said holes being arranged with said short sides being adjacent; and a plurality of V-shaped fastening spring clips made of a conductive material disposed in said rectangular holes, each spring clip having a leg terminating in a hook for engaging one of said recessed shoulders.

2. The subassembly case according to claim 1 wherein each Vshaped fastening spring clip has lateral projections for preventing it from dropping through said rectangular holes.

3. The subassembly case according to claim 1, wherein each V-shaped fastening spring clip has another leg provided with a folded edge.

4. The subassembly case according to claim 3, wherein said another leg has a free end provided with contact means.

* * * * *